(12) United States Patent
Matsumoto et al.

(10) Patent No.: US 8,008,184 B2
(45) Date of Patent: Aug. 30, 2011

(54) SEMICONDUCTOR DEVICE MANUFACTURING METHOD, SEMICONDUCTOR MANUFACTURING APPARATUS AND STORAGE MEDIUM

(75) Inventors: Kenji Matsumoto, Nirasaki (JP); Shigetoshi Hosaka, Nirasaki (JP); Junichi Koike, Sendai (JP); Koji Neishi, Sendai (JP)

(73) Assignees: Tokyo Electron Limited, Tokyo (JP); Tohoku University, Sendai-shi (JP)

( * ) Notice: Subject to any disclaimer, the term of this patent is extended or adjusted under 35 U.S.C. 154(b) by 0 days.

(21) Appl. No.: 12/627,602

(22) Filed: Nov. 30, 2009

(65) Prior Publication Data
US 2010/0112806 A1  May 6, 2010

Related U.S. Application Data (63) Continuation of application No. PCT/JP2008/059906, filed on May 29, 2008.

(30) Foreign Application Priority Data

May 30, 2007  (JP) ................................. 2007-143971

(51) Int. Cl.
*H01L 21/768* (2006.01)
(52) U.S. Cl. ................. 438/618; 438/643; 257/E21.584
(58) Field of Classification Search .......... 438/618–688; 257/E21.584
See application file for complete search history.

(56) References Cited

U.S. PATENT DOCUMENTS

| | | | | |
|---|---|---|---|---|
| 7,413,977 | B2 * | 8/2008 | Shimizu et al. | 438/637 |
| 7,507,659 | B2 * | 3/2009 | Ohtsuka et al. | 438/643 |
| 7,507,666 | B2 * | 3/2009 | Nakao et al. | 438/687 |
| 7,611,984 | B2 * | 11/2009 | Koura et al. | 438/627 |
| 2001/0016418 | A1 | 8/2001 | Kim | |
| 2003/0042613 | A1 * | 3/2003 | Shioya et al. | 257/762 |
| 2003/0136423 | A1 | 7/2003 | Akbar et al. | |
| 2005/0218519 | A1 | 10/2005 | Koike et al. | |
| 2005/0272247 | A1 | 12/2005 | Ikeda et al. | |

(Continued)

FOREIGN PATENT DOCUMENTS
JP  11-191556  7/1999

(Continued)

OTHER PUBLICATIONS

Korean Office Action issued Apr. 18, 2011 in counterpart Korean Application No. Oct. 2009-7025115 (6 pages).

*Primary Examiner* — Savitri Mulpuri
(74) *Attorney, Agent, or Firm* — Oblon, Spivak, McClelland, Maier & Neustadt, L.L.P.

(57) ABSTRACT

A seed layer is formed on a surface of an insulating film and along a recess of the insulating film, and after a copper wiring is buried in the recess, a barrier film is formed, and an excessive metal is removed from the wiring. On a surface of a copper lower layer conductive path exposed at the bottom of the recess, a natural oxide of the copper is reduced or removed. On a substrate from which the natural oxide is reduced or removed, the seed layer, composed of a self-forming barrier metal having oxidative tendency higher than that of copper or an alloy of such metal and copper, is formed. The substrate is heated after burying copper in the recess. Thus, a barrier layer is formed by oxidizing the self-forming barrier metal. An excessive portion of the self-forming barrier metal is deposited on a surface of the buried copper.

14 Claims, 9 Drawing Sheets

U.S. PATENT DOCUMENTS

| | | | |
|---|---|---|---|
| 2006/0113674 A1* | 6/2006 | Toyoda et al. | 257/762 |
| 2007/0001307 A1* | 1/2007 | Usui et al. | 257/758 |
| 2007/0012973 A1* | 1/2007 | Nasu et al. | 257/295 |
| 2007/0173055 A1* | 7/2007 | Ohtsuka et al. | 438/627 |
| 2008/0124932 A1* | 5/2008 | Tateishi et al. | 438/692 |
| 2008/0179747 A1* | 7/2008 | Sakai et al. | 257/751 |
| 2009/0017621 A1* | 1/2009 | Sako et al. | 438/674 |
| 2010/0099254 A1* | 4/2010 | Narushima et al. | 438/668 |
| 2010/0140802 A1* | 6/2010 | Matsumoto et al. | 257/741 |
| 2010/0233876 A1* | 9/2010 | Matsumoto et al. | 438/652 |
| 2010/0323514 A1* | 12/2010 | Isobayashi et al. | 438/618 |

FOREIGN PATENT DOCUMENTS

| | | |
|---|---|---|
| JP | 2001-237311 | 8/2001 |
| JP | 2003-218198 | 7/2003 |
| JP | 2005-277390 | 10/2005 |
| JP | 2005-347472 | 12/2005 |
| JP | 2006-278635 | 10/2006 |

* cited by examiner

SEMICONDUCTOR DEVICE MANUFACTURING METHOD, SEMICONDUCTOR MANUFACTURING APPARATUS AND STORAGE MEDIUM

This application is a Continuation Application of PCT International Application No. PCT/JP2008/059906 filed on May 29, 2008, which designated the United States.

FIELD OF THE INVENTION

The present invention relates to a semiconductor device manufacturing method and a semiconductor manufacturing apparatus for forming a copper wiring by burying copper in a recess formed in an insulating film and a storage medium.

BACKGROUND OF THE INVENTION

A multilayer wiring structure in a semiconductor device is formed by burying a metal wiring in an interlayer insulating film. Cu (copper) is used as a material for this metal wiring because of low electromigration and low resistance, and a damascene process is generally used as a forming process thereof.

In this damascene process, a trench for burying a wiring, which will be arranged inside a layer, and a via hole for burying a connection wiring for connecting upper and lower wirings are formed in an interlayer insulating film of a substrate, and Cu is buried in these recesses by a CVD method, an electroplating method or the like. In the case of using the CVD method, in order to favorably bury Cu, it is necessary to form a very thin Cu seed layer along the surface of the interlayer insulating film and the inner surface of the recess. In the case of using the electroplating method, it is also necessary to form on the recess a Cu seed layer serving as an electrode. Further, since Cu is easily diffused into the insulating layer, it is necessary to form a barrier film including, e.g., a laminated body of Ta/TaN, on the recess. Accordingly, the barrier film and the Cu seed layer are formed on the surface of the insulating film and the inner surface of the recess by, e.g., a sputtering method.

The miniaturization of a wiring pattern has been progressing, so that it is necessary for the barrier film and the seed layer to be thinner. However, if the ratio of the depth of the recess to its width increases, when the barrier film and the seed layer are formed, the metal forming them is formed thickly around the opening of the recess compared to the deep portion of the recess. Thus, it is difficult to form in the recess the barrier film and the seed layer with high uniformity. As a consequence, the reliability against a barrier property or the adhesivity of an interface with the seed layer becomes a problem.

Based on such background, Patent Document 1 discloses a method for forming an alloy layer of Cu and an additive metal, e.g., Mn (manganese), along a surface of a recess of an insulating film, burying Cu as a wiring material in the recess by using the alloy layer as a seed layer, and forming a barrier film by performing an annealing process under an oxygen atmosphere by using a furnace.

The following is detailed description of the state of the alloy layer in the case of performing the annealing process. Mn in the alloy diffuses in the alloy and Cu, and a part of Mn moves to the surface of the interlayer insulating film as if it is separated from Cu. Mn remaining on the surface of the interlayer insulating film reacts with O(oxygen) attached to the surface of the interlayer insulating film, thereby forming a barrier film made of MnxOy as an oxide (x and y being natural numbers, hereinafter, simply referred to as "MnO") that is an extremely stable compound. The excessive Mn which has not been used in the formation of the barrier film moves to the surface side of the alloy film (the opposite side of the interlayer insulating film) and then to the surface of Cu buried in the recess, and is segregated on the surface of Cu. The Mn segregated on the surface of Cu is removed by a post-process. The self-forming barrier film made of MnO thus formed is uniform and extremely thin, and thus contributes to solve the above-described problem.

Further, it is also considered that the Mn which has moved to the surface of the interlayer insulating film reacts with O or Si as constituent elements of the interlayer insulating film, thereby forming a self-forming barrier film made of $MnSi_xO_y$ (x and y being natural numbers). The study thereof is being developed.

Meanwhile, before a CuMn film is formed, a Cu wiring (lower layer wiring) to be electrically connected to a Cu wiring (upper layer wiring) to be buried in a recess is exposed at a bottom portion of the recess of the interlayer insulating film. The exposed lower layer wiring may be oxidized into $Cu_2O$ or CuO by oxygen existing in the atmospheric atmosphere. Hereinafter, the Cu oxides will be simply referred to as CuO. If a CuMn film is formed in that state, Mn in the CuMn film reacts with oxygen in CuO and is oxidized into MnO because of its oxidative tendency higher than that of Cu. As described above, MnO is a stable compound and is passive, and thus does not move in Cu in an annealing process performed after the burying of Cu. Moreover, MnO has high resistance, so that the resistance (via contact resistance) between the upper layer wiring and the lower layer wiring increases, and this may deteriorate the reliability of the Cu wiring.

In the prior art, the CuMn film is formed by, e.g., a sputtering method. However, in order to cope with future trends toward extreme miniaturization of a wiring pattern, it is being studied to form a CuMn film by a CVD method which ensures high coatability and buriability to a recess. In the case of using the sputtering method, CuO exposed to the recess is etched and removed by ions in the plasma. In the case of using the CVD method, however, CuO is not etched. Thus, a more amount of MnO is generated, and an excessive MnO may remain in the wiring.

Patent Document 1: Japanese Patent Laid-open Publication No. 2005-277390 (paragraphs 0042-0045, FIG. 7)

SUMMARY OF THE INVENTION

In view of the above, the present invention provides a technique capable of suppressing remaining of a metal forming a seed layer and remaining of its oxide in a wiring and an increase of wiring resistance in the case of forming a seed layer on a surface of an insulating film and along a recess of the insulating film, forming a barrier film by heating after or before a copper wiring is buried in the recess and removing an excessive portion of the metal forming the seed layer from the wiring. Herein, a process in which Cu atoms remain is referred to as a reducing process, and a process in which Cu atoms are removed is referred to as a removing process.

In accordance with a first aspect of the present invention, there is provided a semiconductor device manufacturing method including: reducing or removing a natural oxide of copper on a surface of a lower layer conductive path exposed at a bottom of a recess formed in an interlayer insulating film of a surface of a substrate; forming a seed layer having a self-forming barrier metal along a wall surface of the recess on the substrate from which the natural oxide is reduced or removed; burying, in the recess, copper forming an upper layer conductive path electrically connected to the lower layer conductive path via the seed layer; and heating the substrate, wherein until the seed layer is formed after the natural oxide of copper is reduced or removed, a formation of the natural oxide of copper is suppressed in an atmosphere to which the substrate is exposed.

In the semiconductor device manufacturing method, the heating the substrate may be performed after copper is buried in the recess.

In the semiconductor device manufacturing method, the heating the substrate may be performed while copper is buried in the recess.

In accordance with a second aspect of the present invention, there is provided a semiconductor device manufacturing method including: reducing or removing a natural oxide of copper on a surface of a lower layer conductive path exposed at a bottom of a recess formed in an interlayer insulating film of a surface of a substrate; burying in the recess an alloy of copper and a self-forming barrier metal forming an upper layer conductive path electrically connected to the lower layer conductive path on the substrate from which the natural oxide is reduced or removed; and heating the substrate, wherein until the alloy is buried in the recess after the natural oxide of copper is reduced or removed, a formation of the natural oxide of copper is suppressed in an atmosphere to which the substrate is exposed.

In the semiconductor device manufacturing method, the heating the substrate may be performed after the alloy is buried in the recess.

In the semiconductor device manufacturing method, the heating the substrate may be performed while the alloy is buried in the recess.

In the semiconductor device manufacturing method, the seed layer may be made of the self-forming barrier metal, or an alloy of the self-forming barrier metal and copper.

In the semiconductor device manufacturing method, the self-forming barrier metal may have a function of preventing copper from being diffused by becoming an oxide.

In the semiconductor device manufacturing method, the self-forming barrier metal may have oxidative tendency higher than that of copper.

In the semiconductor device manufacturing method, the heating the substrate may be carried out to form a barrier film by oxidizing the self-forming barrier metal forming the seed layer and to deposit an excessive portion of the self-forming barrier metal on a surface of the buried copper.

In the semiconductor device manufacturing method, the atmosphere in which the formation of the natural oxide of copper is suppressed may be an inert gas atmosphere.

In the semiconductor device manufacturing method, the atmosphere in which the formation of the natural oxide of copper is suppressed may be a reducing atmosphere.

In the semiconductor device manufacturing method, the natural oxide of copper may be removed by supplying an organic acid to the substrate.

In the semiconductor device manufacturing method, the natural oxide of copper may be removed by sputtering.

In the semiconductor device manufacturing method, the natural oxide of copper may be reduced by supplying an organic acid to the substrate.

In the semiconductor device manufacturing method, the organic acid may be carboxylic acid.

The semiconductor device manufacturing method may further include, after the heating the substrate, removing an excessive portion of the self-forming barrier metal deposited on the surface of copper.

In accordance with a third aspect of the present invention, there is provided a semiconductor manufacturing apparatus for processing a substrate having on a surface thereof a recess in which a natural oxide of copper is formed, the apparatus including: a vacuum transfer chamber module including a transfer chamber of a vacuum atmosphere into which the substrate is loaded and a substrate transfer unit provided in the transfer chamber; a preprocessing module including a processing chamber airtightly connected to the vacuum transfer chamber module and having therein a mounting table for mounting thereon the substrate and a reducing unit or a removing unit for reducing or removing the natural oxide of copper formed in the recess of the substrate; a seed layer forming module including a processing chamber airtightly connected to the vacuum transfer chamber module and having therein a mounting table for mounting thereon the substrate and a seed layer forming unit for forming a seed layer having a self-forming barrier metal along a wall surface of the recess of the substrate; and a control unit for controlling the substrate transfer unit to load the substrate in the vacuum transfer chamber module into the preprocessing module and then transfer the substrate to the seed layer forming module via the vacuum transfer chamber module.

In the semiconductor manufacturing apparatus, the self-forming barrier metal may have a function of preventing copper from being diffused by becoming an oxide.

In the semiconductor manufacturing apparatus, the self-forming barrier metal may have oxidative tendency higher than that of copper.

In the semiconductor manufacturing apparatus, the seed layer may be made of the self-forming barrier metal, or an alloy of the self-forming barrier metal and copper.

In the semiconductor manufacturing apparatus, the reducing unit may reduce the natural oxide of copper by supplying an organic acid to the substrate.

In the semiconductor manufacturing apparatus, the removing unit may remove the natural oxide of copper by supplying an organic acid to the substrate.

In the semiconductor manufacturing apparatus, the removing unit may remove the natural oxide of copper by sputtering.

The semiconductor manufacturing apparatus may further include a film forming module including a processing chamber airtightly connected to the vacuum transfer chamber module and having therein a mounting table for mounting thereon the substrate, and a film forming unit for burying a metal mainly made of copper in the recess of the substrate mounted on the mounting table.

The semiconductor manufacturing apparatus may further include a heating module including a processing chamber airtightly connected to the vacuum transfer chamber module and having therein a mounting table for mounting thereon the substrate, and a heating unit for heating the substrate mounted on the mounting table.

In accordance with a fourth aspect of the present invention, there is provided a storage medium storing a computer program for causing a computer to perform a semiconductor device manufacturing method, wherein the semiconductor device manufacturing method includes: reducing or removing a natural oxide of copper on a surface of a lower layer conductive path exposed at a bottom of a recess formed in an interlayer insulating film of a surface of a substrate; forming a seed layer having a self-forming barrier metal along a wall surface of the recess on the substrate from which the natural oxide is reduced or removed; burying, in the recess, copper forming an upper layer conductive path electrically connected to the lower layer conductive path via the seed layer;

and heating the substrate, wherein until the seed layer is formed after the natural oxide of copper is reduced or removed, a formation of the natural oxide of copper is suppressed in an atmosphere to which the substrate is exposed.

In accordance with a fifth aspect of the present invention, there is provided a storage medium storing a computer program for causing a computer to perform a semiconductor device manufacturing method, wherein the semiconductor device manufacturing method includes: reducing or removing a natural oxide of copper on a surface of a lower layer conductive path exposed at a bottom of a recess formed in an interlayer insulating film of a surface of a substrate; burying in the recess an alloy of copper and a self-forming barrier metal forming an upper layer conductive path electrically connected to the lower layer conductive path on the substrate from which the natural oxide is reduced or removed; and heating the substrate, wherein until the alloy is buried in the recess after the natural oxide of copper is reduced or removed, a formation of the natural oxide of copper is suppressed in an atmosphere to which the substrate is exposed.

In accordance with the first aspect of the present invention, the natural oxide of Cu is reduced or removed from the surface of the lower layer conductive path exposed at the bottom portion of the recess formed in the interlayer insulating film on the surface of the substrate and, then, the seed layer including the self-forming barrier metal is formed on the surface of the interlayer insulating film and along the wall surface of the recess. The substrate is under an atmosphere in which the formation of the natural oxide of Cu is suppressed, e.g., a vacuum atmosphere, an inert gas atmosphere or a reducing atmosphere, until the seed layer is formed. Therefore, the oxidization of the self-forming barrier metal by the natural oxide of Cu which occurs at the bottom portion of the recess is suppressed. Accordingly, when Cu is buried in the recess and the substrate is heated, an excessive portion of the self-forming barrier metal is easily deposited on the surface of Cu. Hence, the remaining of the self-forming barrier metal in the recess is suppressed, and the increase of the wiring resistance is suppressed. As a consequence, this suppresses the deterioration of the reliability.

In accordance with the second aspect of the present invention, after the natural oxide of Cu is reduced or removed, the alloy of Cu and the self-forming barrier metal is buried in the recess. The substrate is under an atmosphere in which the formation of the natural oxide of Cu is suppressed until the alloy is buried in the recess after the natural oxide is reduced or removed. Therefore, the oxidization of the self-forming barrier metal by the natural oxide of Cu which occurs at the bottom portion of the recess is suppressed.

Further, in accordance with the third aspect of the present invention, as in the first aspect, after the natural oxide of Cu is reduced or removed, the seed layer is formed on the surface of the interlayer insulating film and along the wall surface of the recess. Thereafter, Cu is buried in the recess, and the substrate is heated. The substrate is under an atmosphere in which the formation of the natural oxide of Cu is suppressed until the seed layer is formed. Accordingly, the oxidization of the self-forming barrier metal by the natural oxide of Cu which occurs at the bottom portion of the recess is suppressed.

Moreover, in accordance with the fourth aspect of the present invention, as in the second aspect, after the natural oxide of Cu is reduced or removed, until the alloy of Cu and the self-forming barrier metal is buried in the recess and the substrate is heated, the substrate is under an atmosphere in which the formation of the natural oxide of Cu is suppressed. Hence, the oxidization of the self-forming barrier metal by the natural oxide of Cu which occurs at the bottom portion of the recess is suppressed.

DETAILED DESCRIPTION OF THE EMBODIMENT

First, a substrate processing system in a clean room including a semiconductor manufacturing apparatus of the present invention will be described with reference to FIG. 1. A substrate processing system 1 is a system for forming an upper layer wiring (upper layer conductive path) on a surface of a semiconductor wafer (hereinafter, referred to as "wafer") W as a substrate. A reference numeral "2" in FIG. 1 denotes an example of a semiconductor manufacturing apparatus in accordance with an embodiment of the present invention which has a multi-chamber system and processes the wafer W under a vacuum atmosphere. The semiconductor manufacturing apparatus 2 includes formic acid processing modules 3a and 3b for reducing an lower layer wiring (lower layer conductive path) to be electrically connected to the upper layer wiring by performing a heating process while supplying a formic acid; and CuMn CVD modules 5a and 5b for forming on the wafer W an alloy film composed of Cu (copper) and an additive metal, Mn (manganese). A detailed configuration of the semiconductor manufacturing apparatus 2 will be described later.

A reference numeral "11" in the drawing denotes an electroplating apparatus for forming on the wafer W a Cu film constituting a wiring. Further, a reference numeral "12" in the drawing denotes an oxygen annealing apparatus for performing a heating process while supplying oxygen to the wafer W to thereby form a film as will be described later. A reference numeral "13" in the drawing is a CMP (Chemical Mechanical Polishing) apparatus.

Figure 1:
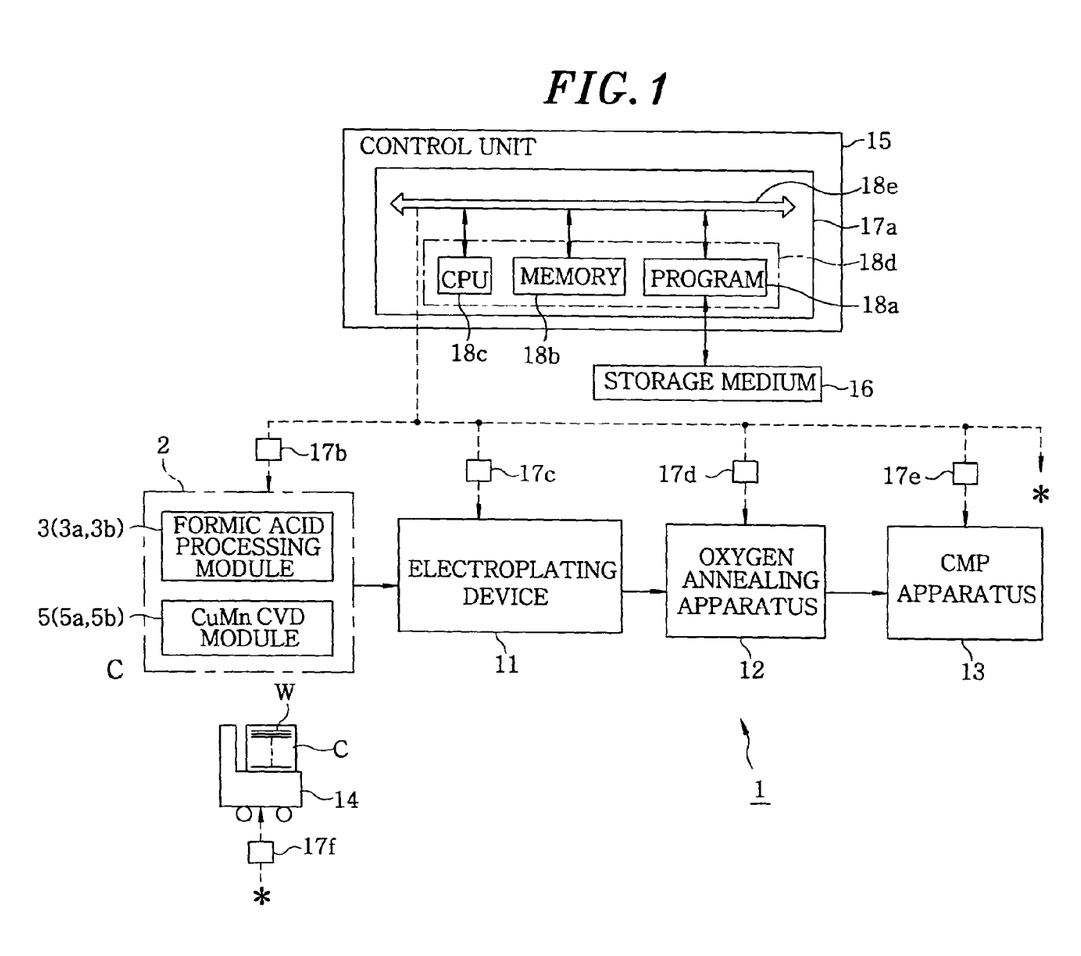
FIG. 1 shows a configuration of a substrate processing system including a semiconductor manufacturing apparatus of the present invention.

A reference numeral "14" in FIG. 1 is an automatic transfer robot for transferring a carrier C accommodating a plurality of, e.g., 25 wafers W, in a clean room. As indicated by arrows in FIG. 1, the automatic transfer robot 14 transfers the carrier C from the semiconductor manufacturing apparatus 2, to the electroplating apparatus 11, to the oxygen annealing apparatus 12 and then to the CMP apparatus 13 in this sequence. The carrier C is referred to as a FOUP (Front Opening Unified Pod) configured as an airtightly sealed carrier whose inside is kept, e.g., under an atmospheric atmosphere.

The substrate processing system 1 includes subordinate computers 17b to 17f for controlling an operation of each apparatus thereof; and a host computer 17a which constitutes a part of a control unit 15 for controlling each of the subordinate computers 17b to 17f. The control unit 15 includes a data processing module 18d having a program 18a, a memory 18b and a CPU 18c. A reference numeral "18e" in the drawing denotes a bus. The program stored in the host computer 17a is a transfer sequence program for transferring the carrier C between the apparatuses. The subordinate computers 17b to 17f include programs for carrying out the aforementioned processes on the wafers W in the carrier C and for forming wiring portions, which will be described later, on the wafers W.

As indicated by dotted arrows in the drawing, the control unit 15 transmits a control signal to each apparatus of the substrate processing system 1 by the program stored in the host computer 17a, and the subordinate computers 17b to 17f of each apparatus controls the components thereof in response to the control signal. The program is stored in a storage medium 16 including, e.g., a flexible disk, a compact disk, a MO (magneto-optical) disk or the like, and is installed in the control unit 15.

Figure 2:
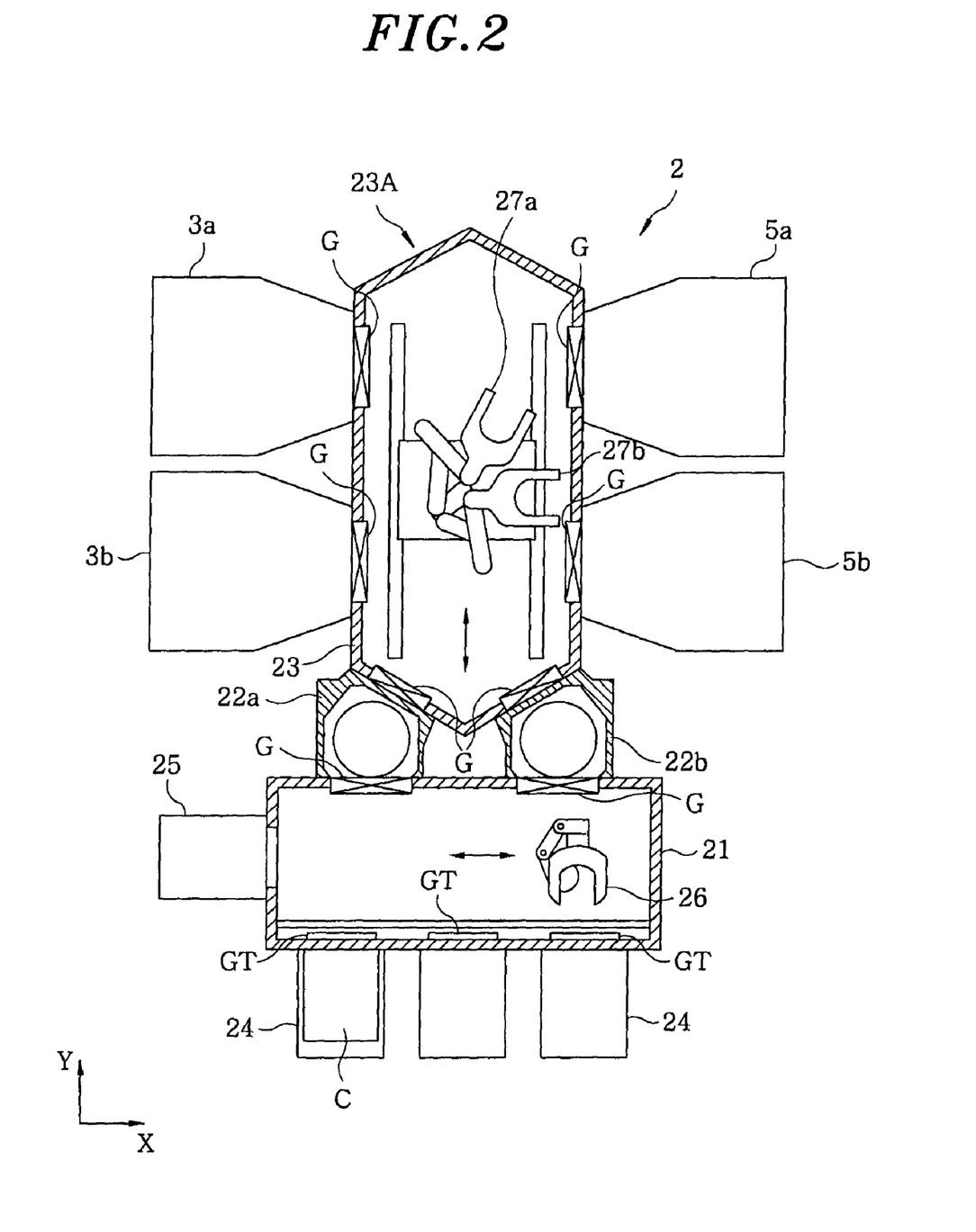
FIG. 2 describes a top view of the semiconductor manufacturing apparatus.

Hereinafter, a configuration of the semiconductor manufacturing apparatus 2 will be explained with reference to FIG. 2. The semiconductor manufacturing apparatus 2 includes a first transfer chamber 21 which constitutes a loader module for loading and unloading the wafer W; load-lock chambers 22a and 22b; and a second transfer chamber 23 serving as a vacuum transfer chamber module 23A. Load ports 24 on which carriers C are respectively loaded are provided at the front side of the first transfer chamber 21, and the carriers C loaded on the respective load ports 24 are connected to the front wall of the first transfer chamber 21. Further, gate doors GT that are opened or closed along with lids of the carriers C are provided at the front wall of the first transfer chamber 21. Moreover, the formic acid processing modules 3a and 3b and the CuMn CVD modules 5a and 5b are airtightly connected to the second transfer chamber 23.

Further, an alignment chamber 25 for adjusting the orientation or the eccentricity of the wafer W is provided on a lateral side of the first transfer chamber 21. Each of the load-lock chambers 22a and 22b includes a vacuum pump and a leak valve (both not shown), and the insides of the load-lock chambers 22a and 22b can be switched between an atmospheric atmosphere and a vacuum atmosphere. Moreover, since the first transfer chamber 21 and the second transfer chamber 23 are kept under the atmospheric atmosphere and the vacuum atmosphere, respectively, the atmosphere in each of the load-lock chambers 22a and 22b is adjusted to and from each of the transfer chambers 21 and 23 when the wafer W is transferred. Furthermore, a notation G in the drawing indicates gate valves (partition valves) which separate the load-lock chambers 22a and 22b from the first or the second transfer chamber 21 or 23, and separate the second transfer chamber 23 from the formic acid processing modules 3a and 3b or the CuMn CVD modules 5a and 5b.

The first and second transfer chambers 21 and 23 include a first transfer unit 26 and second transfer units 27a and 27b, respectively. The first transfer unit 26 is a transfer arm for transferring the wafer W between the carrier C and the load-lock chamber 22a or 22b and between the first transfer chamber 21 and the alignment chamber 25. The second transfer units 27a and 27b are transfer arms for transferring the wafer W between the load-lock chamber 22a, 22b, the formic acid processing modules 3a, 3b and the CuMn CVD modules 5a, 5b. Further, the second transfer chamber 23 and the second transfer unit 27a form the vacuum transfer chamber module 23A.

Figure 3:
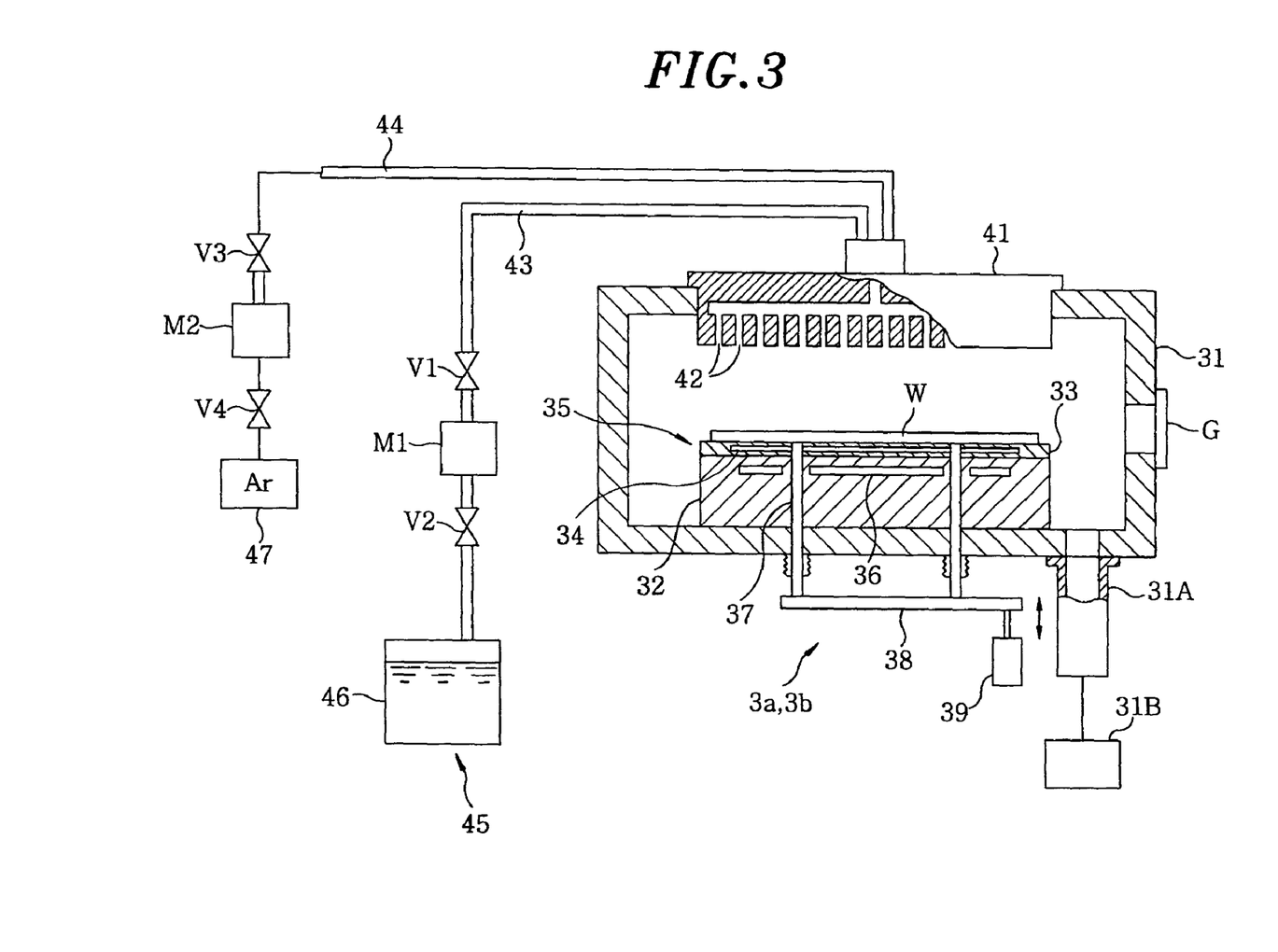
FIG. 3 provides a vertical side view of a formic acid processing module of the semiconductor manufacturing apparatus.

Hereinafter, a configuration of the formic acid processing module 3a as a preprocessing module included in the semiconductor manufacturing apparatus 2 will be described with reference to FIG. 3. Since the formic acid processing module 3b has the same configuration as that of the formic acid processing module 3a, the detailed description thereof will be omitted. A reference numeral "31" in FIG. 3 is a processing chamber configured as a vacuum chamber made of, e.g., Al. Disposed on a bottom portion of the processing chamber 31 is a mounting table 32 for mounting a wafer W thereon. An electrostatic chuck 35, including a dielectric layer 33 and a chuck electrode 34 embedded in the dielectric layer 33, is provided on a top surface of the mounting table 32, and a chuck voltage is applied to the chuck electrode 34 from a power supply unit (not shown).

Further, a heater 36 is provided inside the mounting table 32 to heat the wafer W placed on the electrostatic chuck 35 up to a predetermined temperature. The mounting table 32 is provided with elevating pins 37 for lifting and lowering the wafer W and transferring the wafer W to and from the second transfer units 27a and 27b, the elevating pins 37 being protrusile from and retractable into a mounting surface. The elevating pins 37 are connected to a driving unit 39 via a supporting member 38, and are lifted and lowered by operating the driving unit 39.

A gas shower head 41 is disposed at an upper portion of the processing chamber 31 so as to face the mounting table 32. The gas shower head 41 has on a bottom surface thereof a plurality of gas supply holes 42. Connected to the gas shower head 41 are a first gas supply line 43 for supplying a source gas and a second gas supply line 44 for supplying a dilution gas. The source gas and the dilution gas supplied from the gas supply lines 43 and 44 are mixed together, and this gaseous mixture is supplied into the processing chamber 31 through the gas supply holes 42.

The first gas supply line 43 is connected to a raw material supply source 45 via a valve V1, a mass flow controller M1 serving as a gas flow rate controller and a valve V2. The raw material supply source 45 includes a reservoir 46 made of stainless steel, and carboxylic acid as organic acid, e.g., formic acid, having a reducing power for Cu is stored in the reservoir 46. Further, the second gas supply line 44 is connected to a dilution gas supply source 47 for supplying the dilution gas, e.g., Ar (argon) gas, via a valve V3, a mass flow controller M2 and a valve V4. Also, in supplying the formic acid into the processing chamber 31, a bubbling method which bubbles and evaporates the formic acid in the reservoir 46 by supplying an inert gas to the formic acid may be used.

One end of a gas exhaust pipe 31A is connected to a bottom surface of the processing chamber 31, and the other end of the gas exhaust pipe 31A is connected to a vacuum pump 31B serving as a vacuum evacuation unit. The inner pressure of the processing chamber 31 can be maintained at a predetermined pressure during a formic acid process by a pressure control mechanism (not shown).

Figure 4:
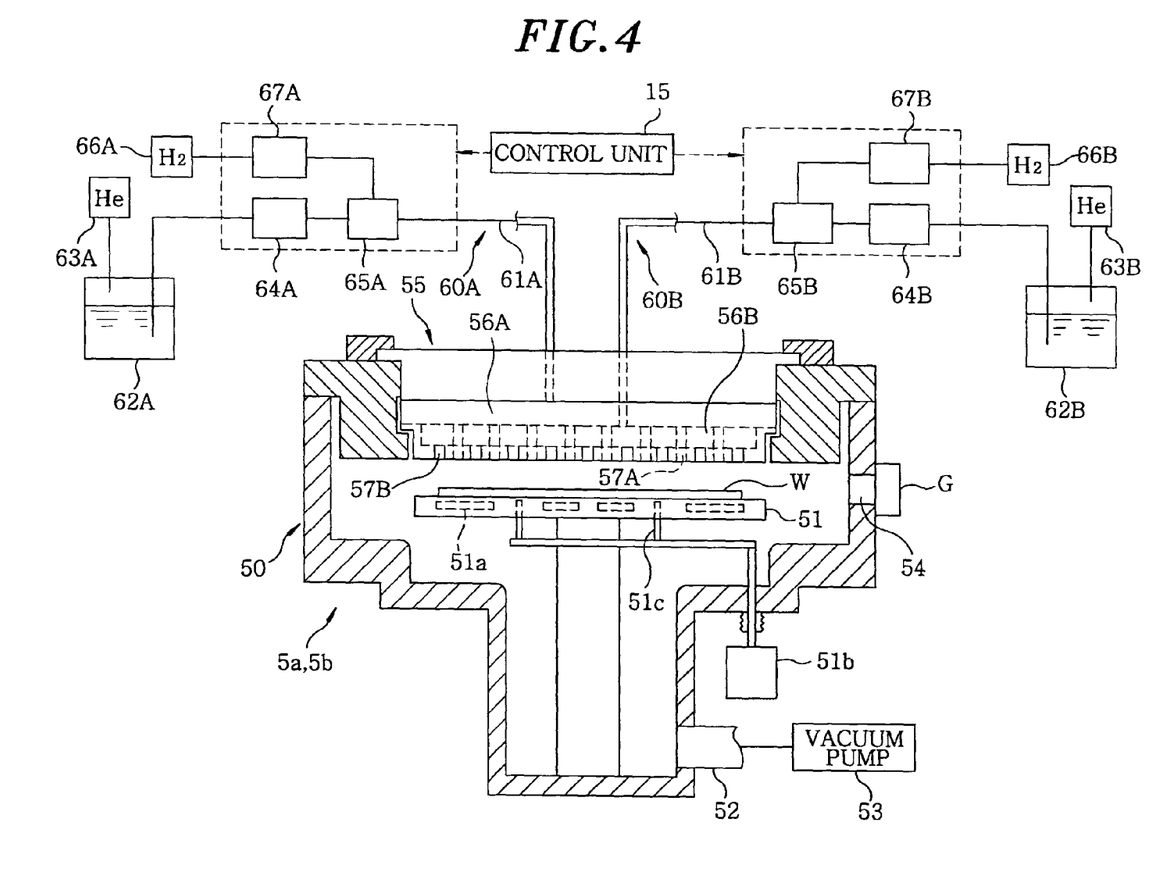
FIG. 4 presents a vertical side view of a CuMn CVD module of the semiconductor manufacturing apparatus.

Hereinafter, a configuration of the CuMn CVD module 5a will be described with reference to FIG. 4. Since the CuMn CVD module 5b has the same configuration as that of the CuMn CVD module 5a, detailed description thereof will be omitted. The CuMn CVD module 5a is a seed layer forming module for forming a CuMn film which serves as a seed layer for burying Cu in the surface of the recess of the interlayer insulating film after completion of the reducing process of the lower layer wiring by the formic acid processing module 3a or 3b and also becomes a barrier film by post-process. The CuMn CVD module 5a includes a processing chamber 50, and a stage for horizontally mounting thereon the wafer W is installed in the processing chamber 50. The stage 51 has therein a heater 51a for controlling a temperature of the wafer W. Further, the stage 51 is provided with three elevation pins 51c (only two are shown for convenience) that can be lifted and lowered by an elevation mechanism 51b. The wafer W is transferred between the second transfer unit 27a or 27b and the stage 51 via the elevation pins 51c. One end of a gas exhaust line 52 is connected to the bottom portion of the processing chamber 50, and the other end of the gas exhaust line 52 is connected to a vacuum pump 53. Moreover, a transfer port 54 that is opened and closed by the gate valve G is formed on the sidewall of the processing chamber 50.

A gas shower head 55 is disposed at a ceiling portion of the processing chamber 50 so as to face the stage 51. The gas shower head 55 has gas chambers 56A and 56B separated from each other, and the gases supplied to the gas chambers 56A and 56B are supplied into the processing chamber 50 through the gas supply holes 57A and 57B.

Connected to the gas shower head 55 are a Cu source gas supply line system 60A for introducing a source gas of Cu into the gas chamber 56A and a Mn source gas supply line system 60B for introducing a source gas of Mn into the gas chamber 56B. The Cu source gas supply line system has a source gas supply line 61A, and an upstream side of the source gas supply line 61A is connected to a source material reservoir 62A. The source material reservoir 62A stores therein liquid Cu(hfac)TMVS as an organic metal compound of Cu forming a CuMn film and also as a betadiketone complex. The source material reservoir 62A is connected to a pressurizing unit 63A. Cu(hfac)TMVS can be ejected toward the gas shower head 55 by pressurizing the inside of the source material reservoir 62A with the use of He gas, Ar gas or the like supplied from the pressurizing unit 63A.

Further, a flow rate controller 64A including a liquid mass flow controller and a valve and a vaporizer 65A for vaporizing Cu(hfac)TMVS are provided in the source gas supply line 61A in that order from the upstream side thereof. The vaporizer 65A vaporizes Cu(hfac)TMVS by mixing it with $H_2$ gas as a carrier gas supplied from a carrier gas supply source 66A, and supplies the vaporized gas to the gas chamber 56A. Moreover, a reference numeral "67A" in FIG. 4 denotes a flow rate controller for controlling a flow rate of the carrier gas and controlling supply and cutoff of the source gas of Cu to the gas chamber 56A in response to a control signal from the control unit 15.

The Mn source gas supply line system 60B has the same configuration as that of the Cu source gas supply line system 60A except that an organic metal compound of Mn, e.g., $(EtCp)_2Mn$ (Bisethylcylopentadienyl manganese), is stored in a liquid state in a source material reservoir 62B corresponding to the source material reservoir 62A. Reference numerals "61B", "63B", "64B", "65B", "66B" and "67B" represent a source gas supply line, a pressurizing unit, a flow rate controller of a Mn liquid source material, a vaporizer, a carrier gas supply source and a flow rate controller of the carrier gas, respectively. The gas shower head 55, the Cu source gas supply line system 60A and the Mn source gas supply line system 60B constitute a seed layer forming unit to be described in the claims.

Figure 5A:
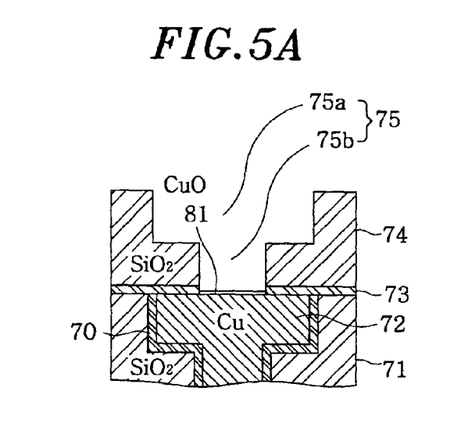
FIGS. 5A to 5F offer flowcharts describing a state in which a wiring is formed by the semiconductor manufacturing apparatus.

Hereinafter, the wafer W processed by the above-described substrate processing system 1 will be explained with reference to FIG. 5A. Before the wafer W is transferred to this substrate processing system 1, a lower layer wiring 72 made of mainly Cu is formed, on the surface of the wafer W, in an interlayer insulating film 71 made of $SiO_2$ (silicon oxide) via a barrier film 70, and an interlayer insulating film 74 is laminated on the interlayer insulating film 71 via a barrier film 73. The barrier film is composed of, e.g., SiN, SiCN or SiC. Further, a recess 75 including a trench 75a and a via hole 75b is formed in the interlayer insulating film 74, and the lower layer wiring 72 is exposed at the bottom portion of the recess 75. The exposed portion is oxidized into CuO 81 by oxygen in the atmosphere until the wafer W is transferred to the substrate processing system 1. A process to be described below is a process for forming an upper layer wiring electrically connected with the lower layer wiring 72 by burying Cu in the recess 75. Although an $SiO_2$ film has been described as an example of the interlayer insulating film, it is also possible to employ a TEOS film, or a Low-k film to be described later, e.g., SiC, SiN, SiCN, SiOCH, porous silica, porous methyl silsesquioxane, SILK (registered trademark of Dow Chemical Company), an organic film such as polyarylene, or the like.

The process for forming an upper layer wiring will be explained with reference to FIGS. 5A to 5F and 6A to 6E. FIGS. 5A to 5F are cross sectional views describing a manufacturing process of a semiconductor device formed on the surface of the wafer W. FIGS. 6A to 6E show the state of changes in the recess 75 which occur when the wafer W is processed by each apparatus in the substrate processing system. In FIGS. 6A to 6E, the structure of the recess 75 is simplified to focus on the changes.

First, a carrier C is transferred to the semiconductor manufacturing apparatus 2 by the automatic transfer robot 14 and is mounted on the load port 24. Then, the gate door GT and the lid of the carrier C are opened simultaneously, and a wafer W in the carrier C is loaded into the first transfer chamber 21 by the first transfer unit 26. Thereafter, the wafer W is transferred to the alignment chamber 25, and the orientation or the eccentricity of the wafer W is adjusted therein. Then, the wafer W is transferred into the load-lock chamber 22a (or 22b). After the inner pressure of the load-lock chamber 22a (or 22b) is adjusted, the wafer W is transferred from the load-lock chamber 22a (or 22b) to the second transfer chamber 23 by the second transfer unit 27a (or 27b). Subsequently, a gate valve G of one of the formic acid processing modules 3a and 3b is opened. Herein, the gate valve G of the formic acid processing module 3a is opened, so that the wafer W is loaded into the formic acid processing module 3a by the second transfer unit 27a (or 27b).

After the wafer W is loaded into the processing chamber 31 of the formic acid processing module 3a and is mounted on the electrostatic chuck 35 on the mounting table 32 via the elevating pins 37, the gate valve G is closed. Then, the processing chamber 31 is evacuated to vacuum by the vacuum pump 31B, and the wafer W is heated to a predetermined temperature by the heater 36 of the mounting table 32. Then, the valves V1 to V4 are opened. Herein, the gas supply lines 43 and 44 are described to be opened or closed by the valves V1 to V4 for the simplicity of explanation. However, an actual gas line system is complicated and the opening and closing of the gas supply lines 43 and 44 are carried out by shut off valves or the like. Further, when the inside of the processing chamber 31 communicates with the inside of the reservoir 46 by opening the first gas supply line 43, vapor (source gas) in the reservoir 46 is introduced into the gas shower head 41 via the first gas supply line 43 at the flow rate adjusted by the mass flow controller M1.

Figure 5B:
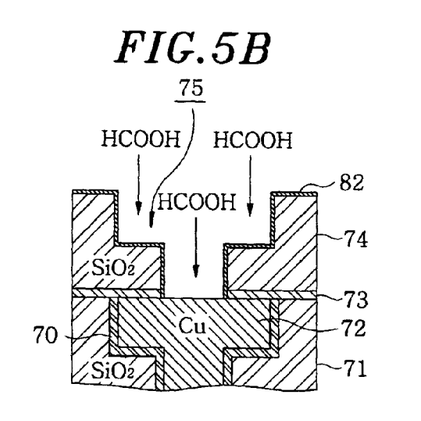

Meanwhile, Ar gas as the dilution gas is supplied into the gas shower head 41 from the dilution gas supply source via the second gas supply line 44 at the flow rate adjusted by the mass flow controller M2. In the gas shower head 41, the Ar gas is mixed with the formic acid vapor. This gaseous mixture is supplied to the wafer W through the gas supply holes 42 of the gas shower head 41 (FIG. 5B).

Figure 6A:
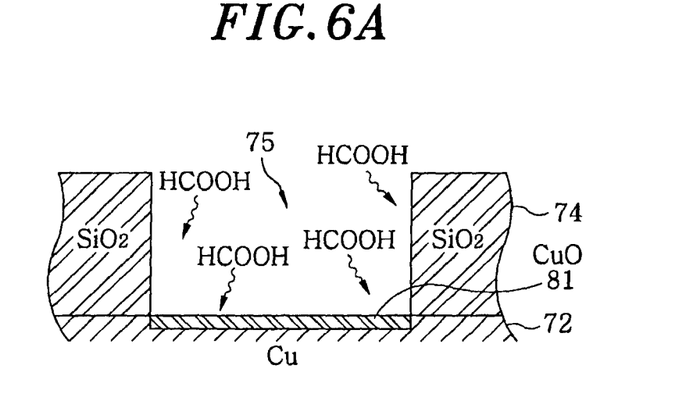
FIGS. 6A to 6E explain a state of a recess in a substrate processed by the semiconductor manufacturing apparatus.
Figure 6B:
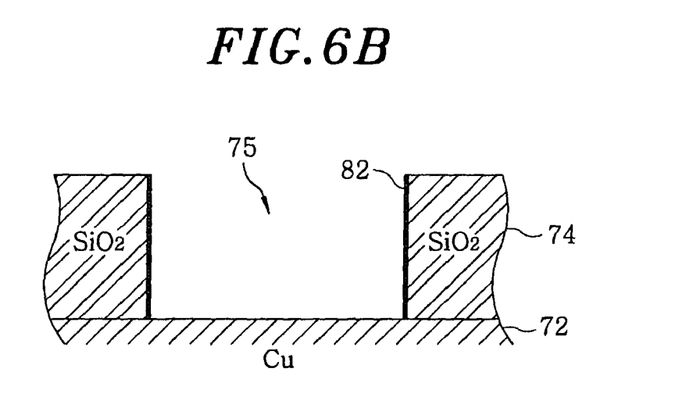

As will be described in the following reaction scheme 1, the formic acid supplied to the wafer W reacts with the CuO 81 of the exposed lower layer wiring 72, and the CuO 81 is reduced to Cu. Moreover, although it is not shown, oxygen and water in the atmosphere are attached to the recess 75, e.g., until the wafer W is transferred to the semiconductor manufacturing apparatus 2 or until the wafer W is transferred from the semiconductor manufacturing apparatus 2 to the formic acid processing module 3a, and the supplied formic acid is also attached to the recess 75. The formic acid, the water and the oxygen attached to and remaining in the recess 75 are indicated as an oxygen supply layer 82 (FIGS. 5B, 6A and 6B).

$Cu_2O + HCOOH \rightarrow 2Cu + H_2O + CO_2$ (reaction scheme 1)

For example, with the lapse of a predetermined period of time after the valves V1 to V4 are opened, the valves V1 to V4 are closed, and the supply of the formic acid vapor and the Ar gas is stopped. Thereafter, the gate valve G is opened, and the second transfer unit 27a (or 27b) disposed in the second transfer chamber 23 of a vacuum atmosphere moves into the processing chamber 31. The elevating pins 37 are lifted to transfer the wafer W, which has been subjected to the formic acid process, onto the second transfer unit 27a (or 27b). Thereafter, the gate valve G of one of the CuMn CVD modules 5a and 5b is opened. Herein, the gate valve of the CuMn CVD module 5a is described to be opened, so that the second transfer unit 27a (or 27b) transfers the wafer W to the processing chamber 50 of the CuMn CVD module 5a. Further, the second transfer chamber 23 where the second transfer unit 27a (or 27b) is disposed is kept at a vacuum atmosphere, and the formation of a natural oxide of Cu on the wafer W is suppressed.

The wafer W loaded into the processing chamber 50 of the CuMn CVD module 5a is delivered to the elevating pins 51c by the second transfer unit 27a (or 27b), and then is mounted on the stage 51. Further, the heater 51a of the stage 51 heats the wafer W to a predetermined temperature.

Figure 5C:
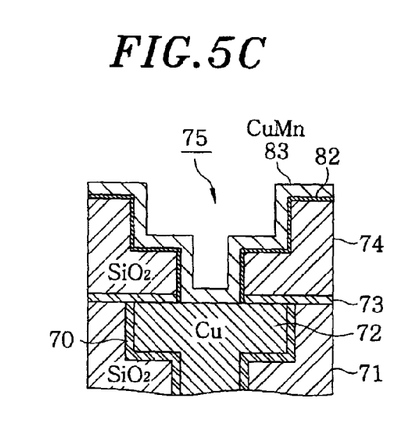

Next, while the source gas of Cu is supplied into the processing chamber 50 at a predetermined flow rate, the source gas of Mn is supplied into the processing chamber 50. Accordingly, a CuMn film 83 as a seed layer is formed on the surface of the recess 75 along the shape of the recess 75 (FIG. 5C).

For example, with the lapse of a predetermined period of time after the supply of the source gas of Mn and the source gas of Cu is started, the supply of those gases to the processing chamber 50 is stopped. Then, the gate valve G is opened, and the second transfer unit 27a (or 27b) moves into the processing chamber 50. The elevating pins 51c are lifted to transfer the processed wafer W onto the second transfer unit 27a (or 27b), and the second transfer unit 27a (or 27b) transfers the wafer W to the first transfer unit 26 via the load-lock chamber 22a (or 22b). Then, the wafer W is returned back into the carrier C by the first transfer unit 26.

Figure 5D:
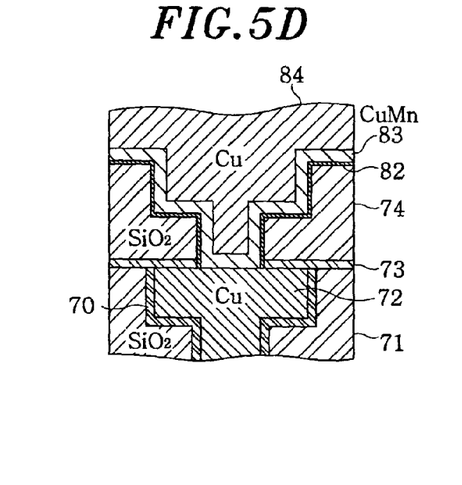
Figure 6C:
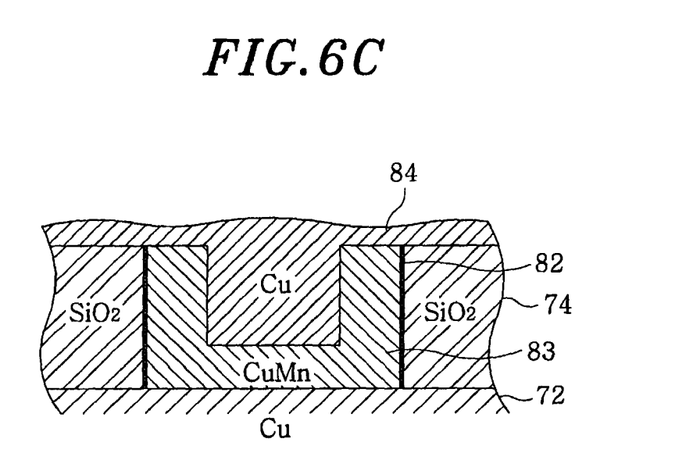
Figure 6D:
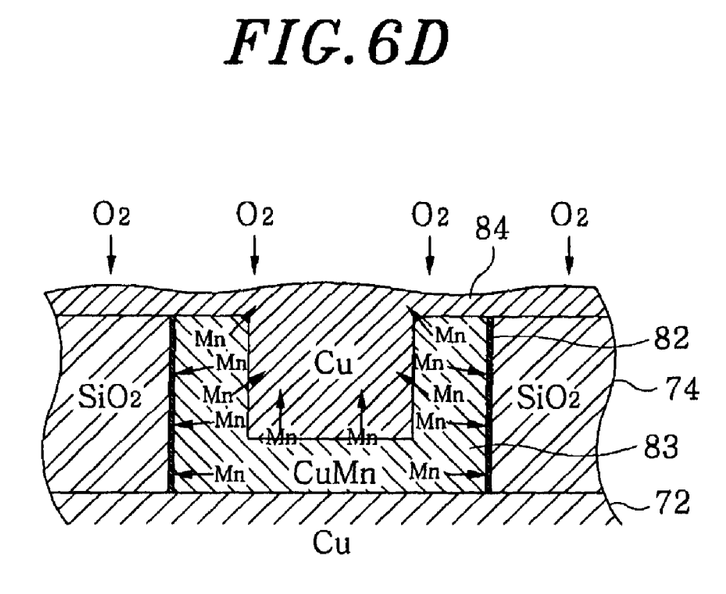

If each wafer W is returned back into the carrier C, the carrier C is transferred to the electroplating apparatus 11 by the automatic transfer robot 14. Thereafter, each wafer W is taken out of the carrier C, and Cu 84 is buried in the recess 75 (FIGS. 5D and 6C).

Figure 5E:
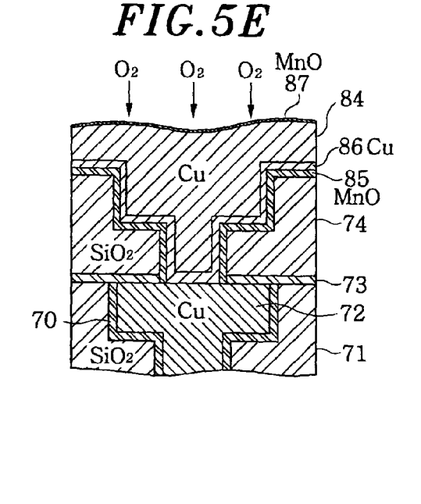
Figure 5F:
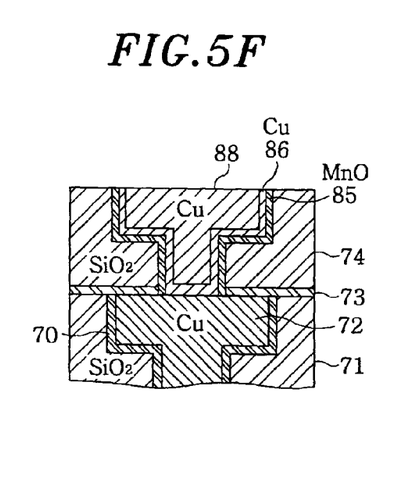
Figure 6E:
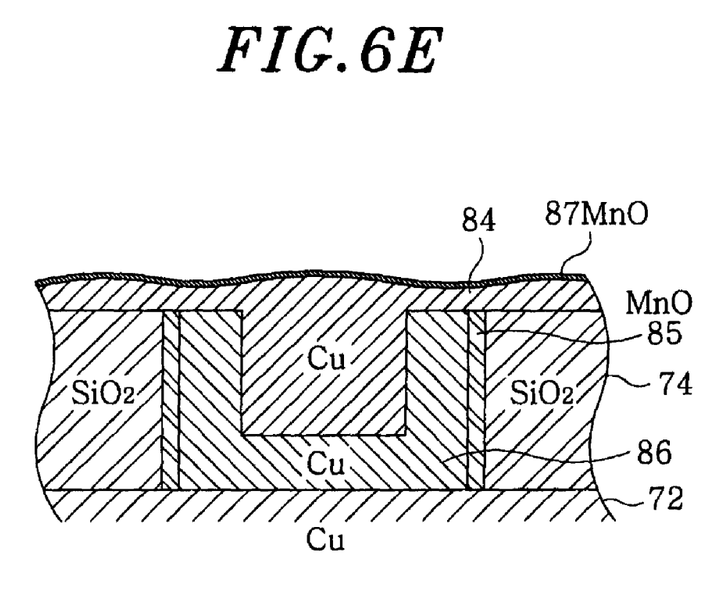

In the following, an expression that "a wafer W is transferred" will be used to simplify explanation. The wafer W in which the Cu 84 is buried is transferred to the oxygen annealing apparatus 12 and annealed to a predetermined temperature by oxygen supplied thereto. As a result of the annealing process, Mn in the CuMn film 83 moves to be separated from Cu in the CuMn film 83, and the separation of Cu and Mn progresses, as can be seen from FIG. 6D. Accordingly, Mn that has moved to an interface with the SiO$_2$ film 74 reacts with oxygen molecules independently existing in the oxygen supply layer 82, oxygen in water molecules, and oxygen in the formic acid molecules, thus forming a MnO film 85. The MnO film 85 functions as a barrier layer for preventing diffusion of the Cu 84 buried in the recess 75 into the SiO$_2$ film 74. Further, the excessive Mn, that has not been used for the formation of the MnO film 85, included in the CuMn film 83 moves toward the surface side of the CuMn film 83, so that a Cu film 86 is formed from the CuMn film 83. Moreover, Mn that has moved toward the surface side of the CuMn film 83 moves further toward the surface side of the Cu 84, and then is deposited on the surface of the Cu 84. The deposited Mn is oxidized by oxygen supplied thereto, so that an MnO film 87 is formed (FIGS. 5E and 6E). As described in the "Background of the invention" section, there is a hypothesis that a barrier film made of MnSixOy is formed by the reaction between Mn diffused to the SiO$_2$ film 74 and oxygen contained in the SiO$_2$ film 74. However, the present inventors consider that an MnO film as a barrier film is formed by oxygen molecules remaining in the interface between CuMn film 83 and the oxygen supply layer 82 formed as a result of the formic acid process, as described above.

After completion of the annealing process, the wafer W is transferred to the CMP apparatus 13 and subjected to the CMP process. The MnO film 87, the Cu 84 laminated at portions other than the recess 75, and the Cu film 86 and the MnO film 85 on the surface of the wafer W are removed, so that an upper layer wiring 88 electrically connected to the lower layer wiring 72 is formed, as can be seen from FIG. 5F.

In accordance with this embodiment, after the CuO 81 formed on the surface of the lower layer wiring 72 exposed at the bottom portion of the recess 75 formed in the interlayer insulating film 74 on the surface of the wafer W is reduced in the formic acid processing module 3a (or 3b), the wafer W is transferred to the CuMn CVD module 5a (or 5b) via the second transfer chamber 23 of a vacuum atmosphere. In this CuMn CVD module 5a (or 5b), the CuMn film 83 is formed in the recess 75. Thus, Mn in the CuMn film 83 is prevented from becoming MnO that is passive by obtaining oxygen from the CuO 81. Accordingly, when the wafer W is annealed after the Cu 84 is buried in the recess 75, Mn can easily move toward the surface side of the Cu 84. Hence, the remaining of Mn in the upper layer wiring 88 made of Cu is suppressed, and an increase of wiring resistance of the upper layer wiring 88 and an increase of wiring resistance between the upper layer wiring 88 and the lower layer wiring 72 are suppressed.

In this embodiment, the wafer W is heated to a predetermined temperature during the step of forming the seed layer in the CuMn CVD modules 5a and 5b. Therefore, the effects of the above-described annealing process are also obtained in the step of forming the seed layer and the following step of burying Cu in the recess 75 of the wafer W.

Figure 7A:
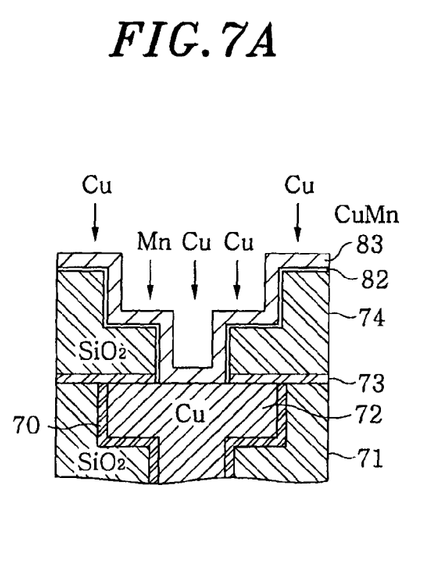
FIGS. 7A to 7D illustrate a state in which a wiring is formed by the semiconductor manufacturing apparatus.
Figure 7B:
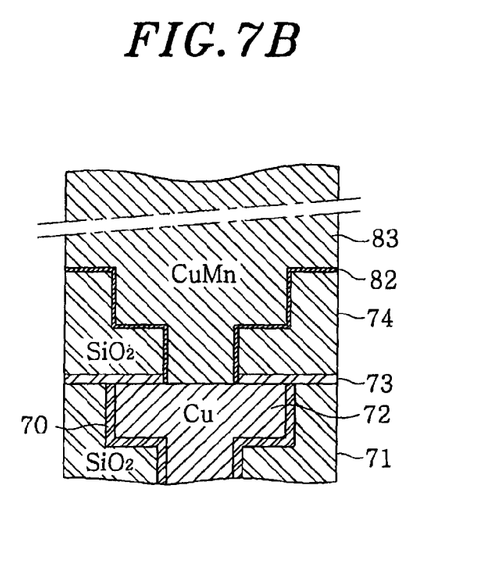
Figure 7C:
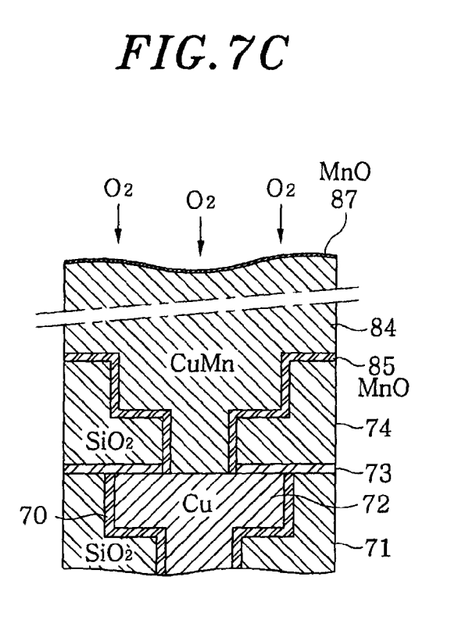
Figure 7D:
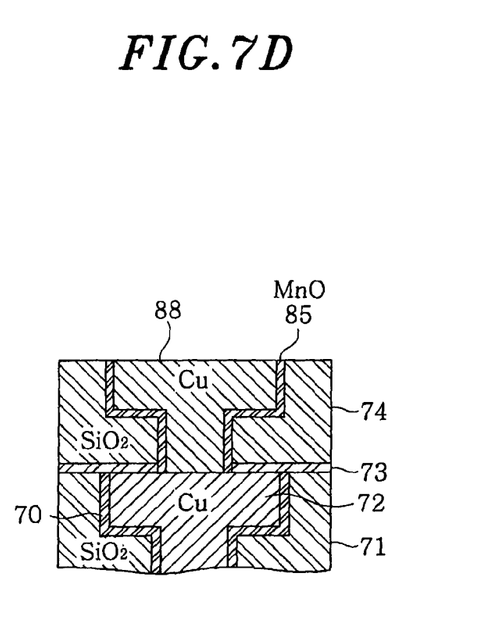

In a modification of the above-described embodiment, even after the CuMn film 83 as the seed layer is formed by supplying the source gas of Cu and the source gas of Mn in the CuMn CVD modules 5a and 5b, the supply of the source gases is continued, so that the recess 75 is filled with CuMn, as illustrated in FIGS. 7A and 7B. Next, as shown in FIG. 7C, the annealing process is carried out, so that the MnO film 85 as the barrier film is formed. Then, the CMP process is performed by the CMP apparatus 13 (FIG. 7D), thereby forming the upper layer wiring 88. Accordingly, the effects same as those of the above-described embodiment can be obtained. In this modification, in order to increase the buriability to the recess 75, a film forming speed may be slow at the initial stage of the process and fast at the end of the process. In order to increase the film forming speed, it is possible to increase a gas flow rate, a film forming pressure or the like.

As for an additive metal added to Cu in the seed layer of the above-described embodiment, it is preferable to use one having oxidative tendency higher than that of Cu. For example, Nb, Zr, Cr, V, Y, Tc, Re or the like may be used as an additive metal, instead of Mn. Moreover, the seed layer of the above-described embodiment is not limited to an alloy film, and may also be a film made of a single metal selected from the examples of the additive metal, e.g., a film made of Mn, or may be a laminated film of the additive metal and Cu.

Moreover, the CuO 81 of the lower layer wiring 72 can be reduced by supplying an organic acid, other than the formic acid to the recess 75. For example, a carboxylic acid such as H(hfac) (hexafluoroacetylacetone), TFAA (trifluoro acetic anhydride), acetic acid or the like is preferably used because it contains oxygen in its molecules and reduces the CuO 81 as in the case of the formic acid. Further, when the carboxylic acid is supplied to the recess 75, the oxygen supply layer 82 is easily formed, and a barrier film made of MnO is easily formed by the oxygen.

Besides, the CuO 81 may be reduced by supplying a reducing gas such as $H_2$ gas, CO gas, $NH_3$ gas or the like, instead of the organic acid, to the recess 75 and heating the wafer W in a state where a reducing atmosphere is formed around the wafer W. Further, the CuO 81 may be physically etched and removed by sputtering, instead of the reduction. In that case, a sputtering module, including a processing chamber and a mounting table corresponding to those of the formic acid processing modules 3a and 3b, for sputtering the surface of the wafer W mounted on the mounting table is connected to the second transfer chamber 23. Moreover, the CuO 81 can be also etched by supplying an organic acid to the wafer W. In that case, e.g., a processing module having a configuration same as that of the formic acid processing modules 3a and 3b is used. However, the processing conditions such as a flow rate of a gas containing an organic acid, a processing pressure and the like are properly set for the etching.

Further, although the CuMn film 83 is formed by a so-called thermal CVD that heats a substrate while supplying a film forming gas to the wafer W in the above-described embodiment, it can also be formed by a plasma CVD method or a photo CVD method. Moreover, the CuMn film 83 may be formed by laminating extremely thin layers by using an ALD method, which is a modification of the CVD method, for intermittently supplying a gas to the wafer W.

Figure 8:
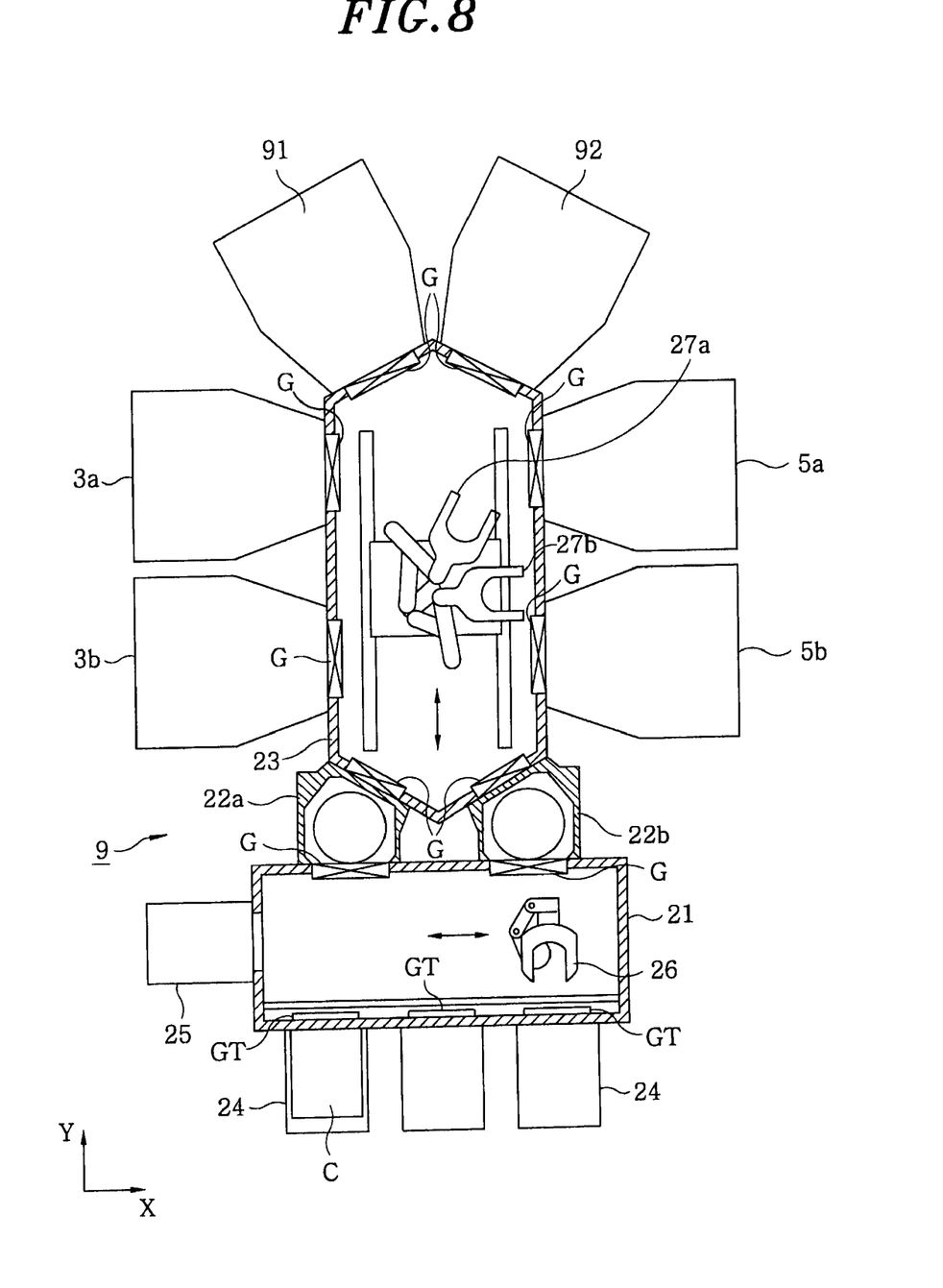
FIG. 8 sets forth a top view showing a configuration of another semiconductor manufacturing apparatus.

In addition, the recess 75 may be filled with Cu 84 by an electroless plating method, instead of the electroplating method. Moreover, the CuMn film 83 may be formed by various CVD methods. FIG. 8 illustrates a semiconductor manufacturing apparatus 9 having a Cu CVD module 91 for burying Cu in the recess 75. The Cu CVD module 91 is configured same as the CuMn CVD modules 5a and 5b except that processing conditions such as a film forming source, a processing pressure, a processing temperature and the like are different. Further, the semiconductor manufacturing apparatus 9 has an oxygen annealing module 92 as a heating module. The oxygen annealing module 92 corresponds to the oxygen annealing apparatus 12. The oxygen annealing module has the same configuration as, e.g., the formic acid processing modules 3a and 3b and is provided with a processing chamber and a mounting table having a heater for heating the wafer W to a predetermined temperature. However, a heating temperature of the wafer W, a processing pressure, types of processing gases and the like are different from those in the formic acid processing modules 3a and 3b.

In the semiconductor manufacturing apparatus 9, the wafer W is transferred from the carrier C, to the formic acid processing module 3a (or 3b), to the CuMn CVD module 5a (or 5b), to the Cu CVD module 91, to the oxygen annealing module 92, and then to the carrier C in this sequence. Thereafter, the wafer W is processed by the CMP apparatus 13. This configuration is preferable in that the oxidation of Mn in the CuMn film 83 can be further suppressed until the oxygen annealing process is carried out. Further, in the Cu CVD module 91, by burying Cu in the recess 75 and heating the wafer W, the MnO film 85 as a barrier film may be formed, and the excessive Mn may be deposited on the surface of the Cu 84 buried in the recess 75, as in the oxygen annealing apparatus 12 of the above-described embodiment.

In the above-described embodiment, the lower layer wiring 72 is prevented from being oxidized again by transferring the wafer W through the second transfer chamber 23 of a vacuum atmosphere (atmosphere in which the formation of a natural oxide of Cu is suppressed) until the CuMn film is formed after the CuO 81 is reduced. However, it is also preferable that, for example, the oxidation of the lower layer wiring 72 is suppressed by transferring the wafer W through the second transfer chamber 23 of an inert gas atmosphere formed by a gas such as $N_2$, He, Ne or Ar gas, for example, which does not react with Cu, until the CuMn film 83 is formed after the CuO 81 is reduced. Moreover, a reducing atmosphere can be formed in the second transfer chamber 23 by supplying a gas capable of reducing Cu, such as $H_2$ gas, CO gas, $NH_3$ gas or the like, to the second transfer chamber 23.

What is claimed is:

1. A semiconductor device manufacturing method comprising:
   reducing or removing a natural oxide of copper on a surface of a lower layer conductive path exposed at a bottom of a recess formed in an interlayer insulating film of a surface of a substrate by supplying an organic acid to the substrate;
   forming an oxygen supplying layer in the recess from organic acid;
   forming a seed layer having a self-forming barrier metal along a wall surface of the recess on the substrate from which the natural oxide is reduced or removed;
   after forming the oxygen supplying layer, burying, in the recess, copper forming an upper layer conductive path electrically connected to the lower layer conductive path via the seed layer; and
   heating the substrate,
   wherein until the seed layer is formed after the natural oxide of copper is reduced or removed, a formation of the natural oxide of copper is suppressed in an atmosphere to which the substrate is exposed.

2. The semiconductor device manufacturing method of claim 1, wherein said heating the substrate is performed after copper is buried in the recess.

3. The semiconductor device manufacturing method of claim 1, wherein said heating the substrate is performed while copper is buried in the recess.

4. A semiconductor device manufacturing method comprising:
   reducing or removing a natural oxide of copper on a surface of a lower layer conductive path exposed at a bottom of a recess formed in an interlayer insulating film of a surface of a substrate by supplying an organic acid to the substrate;

forming an oxygen supplying layer in the recess from organic acid;

after forming the oxygen supplying layer, burying in the recess an alloy of copper and a self-forming barrier metal forming an upper layer conductive path electrically connected to the lower layer conductive path on the substrate from which the natural oxide is reduced or removed; and heating the substrate, wherein until the alloy is buried in the recess after the natural oxide of copper is reduced or removed, a formation of the natural oxide of copper is suppressed in an atmosphere to which the substrate is exposed.

5. The semiconductor device manufacturing method of claim 4, wherein said heating the substrate is performed after the alloy is buried in the recess.

6. The semiconductor device manufacturing method of claim 4, wherein said heating the substrate is performed while the alloy is buried in the recess.

7. The semiconductor device manufacturing method of claim 1, wherein the seed layer is made of the self-forming barrier metal, or an alloy of the self-forming barrier metal and copper.

8. The semiconductor device manufacturing method of claim 1 or 4, wherein the self-forming barrier metal has a function of preventing copper from being diffused by becoming an oxide.

9. The semiconductor device manufacturing method of claim 1 or 4, wherein the self-forming barrier metal has oxidative tendency higher than that of copper.

10. The semiconductor device manufacturing method of claim 1, wherein said heating the substrate is carried out to form a barrier film by oxidizing the self-forming barrier metal forming the seed layer and to deposit an excessive portion of the self-forming barrier metal on a surface of the buried copper.

11. The semiconductor device manufacturing method of claim 1 or 4, wherein the atmosphere in which the formation of the natural oxide of copper is suppressed is an inert gas atmosphere.

12. The semiconductor device manufacturing method of claim 1 or 4, wherein the atmosphere in which the formation of the natural oxide of copper is suppressed is a reducing atmosphere.

13. The semiconductor device manufacturing method of claim 1 or 4, wherein the organic acid is carboxylic acid.

14. The semiconductor device manufacturing method of claim 1 or 4, further comprising, after said heating the substrate, removing an excessive portion of the self-forming barrier metal deposited on the surface of copper.

* * * * *